(12) United States Patent
Li

(10) Patent No.: US 9,054,482 B1
(45) Date of Patent: Jun. 9, 2015

(54) LASER DIODE STACK ASSEMBLY AND METHOD OF MANUFACTURING

(71) Applicant: Jiang Li, Tigard, OR (US)

(72) Inventor: Jiang Li, Tigard, OR (US)

( * ) Notice: Subject to any disclaimer, the term of this patent is extended or adjusted under 35 U.S.C. 154(b) by 0 days.

(21) Appl. No.: 14/271,709

(22) Filed: May 7, 2014

(51) Int. Cl.
| | |
|---|---|
| *H01S 3/04* | (2006.01) |
| *H01S 5/022* | (2006.01) |
| *H01S 5/024* | (2006.01) |
| *H01S 5/40* | (2006.01) |
| *H01L 23/36* | (2006.01) |
| *H01L 21/48* | (2006.01) |
| *H01L 23/367* | (2006.01) |
| *H01L 27/15* | (2006.01) |

(52) U.S. Cl.
CPC ............. *H01S 5/02248* (2013.01); *H01S 5/024* (2013.01); *H01S 5/4025* (2013.01); *H01S 3/0405* (2013.01); *H01S 3/04* (2013.01); *H01S 5/405* (2013.01); *H01L 23/36* (2013.01); *H01L 23/3672* (2013.01); *H01L 23/3677* (2013.01); *H01L 27/156* (2013.01); *H01L 21/4871* (2013.01)

(58) Field of Classification Search
CPC ..... H01S 3/0405; H01S 5/4025; H01S 5/405; H01L 23/36; H01L 23/3672; H01L 23/3677; H01L 27/156; H01L 21/4871

USPC ............ 372/36, 34, 50.12, 50.1; 438/122, 34
See application file for complete search history.

(56) References Cited

U.S. PATENT DOCUMENTS

| | | | | |
|---|---|---|---|---|
| 5,877,672 | A * | 3/1999 | Tsuda et al. | 338/22 R |
| 5,903,583 | A * | 5/1999 | Ullman et al. | 372/35 |
| 6,310,900 | B1 | 10/2001 | Stephens | |
| 6,352,873 | B1 * | 3/2002 | Hoden | 438/28 |
| 2008/0037602 | A1 * | 2/2008 | Thiagarajan et al. | 372/36 |
| 2014/0200636 | A1 * | 7/2014 | Reichert et al. | 607/89 |

* cited by examiner

*Primary Examiner* — Kinam Park
(74) *Attorney, Agent, or Firm* — WHGC, P.L.C.; John F. O'Rourke

(57) ABSTRACT

A laser diode sub-assembly includes a plurality of laser diode bars, electrically conductive spacers and electrically insulative heat spreaders. The spacers and laser diode bars are arranged by alternating to affix each other via the solder preforms and aligned on the front surfaces, while the back surfaces of the spacers affix the top metalized surfaces of the heat spreaders via the same type of solder preforms. Specially designed fixtures can hold all the components in positions and go through the reflowing. The subassembly can be formed by one heating step. The laser diode stack can be formed by soldering the bottom metalized surfaces of the heat spreaders, via a lower melting temperature solder preform, to a heat sink.

13 Claims, 8 Drawing Sheets

LASER DIODE STACK ASSEMBLY AND METHOD OF MANUFACTURING

BACKGROUND OF THE INVENTION

Laser diode bar stacks are generally used in a wide variety of industrial and research applications. Pluralities of laser diode bars are mounted up on a substrate to provide the multiplied power of numerous bars, versus the effect offered by a single bar. Various techniques are known for interconnecting the individual laser diode bars. For example, U.S. Pat. Nos. 5,040,187 and 5,284,790 disclose a substrate with a plurality of spaced apart parallel rectangular grooves. A continuous metallization pattern can be formed from one wall side of one groove to the other wall side of the next groove. The width of the grooves can be selected to be slightly smaller than the width of the individual laser diode bar. The substrate can be flexed to spread out the grooves apart to enable the laser diode bars to be inserted therein. When the substrate returns to a normal position, the laser diode bars are firmly compressed within the grooves to provide a secure electrical connection between the electrodes on the laser diode bars and the metallization layers on the substrate. Unfortunately, when packaged such an arrangement may cause tensile stress on the laser diode bars which can cause damage, and have to be used with soft solder. Also the methods and configurations of the disclosures are not conducive to laser diode bars alignment, as the bars tend to tip and roll within the grooves during assembly.

U.S. Pat. No. 5,128,951 to Karpinski also shows a particular type of laser diode array and method of fabrication. The disclosure has to do with providing an inexpensive mode of manufacturing a laser diode bar array. A substrate can be provided with two layers, an upper conductive layer immediately above and in flush contact with a lower non-conductive layer. The grooves for receiving the diode bars are cut into the substrate so as to completely pierce the upper layer. The disclosure purports thereby to provide a means for mounting laser diode bars which promotes conductivity between bars while also providing heat transfer into the lower electrically insulation layer. However, the maximized alignment of the bars in the grooves can be not described.

In order to avoid the disadvantage above on the laser diode bars, alternate methods for electrically interconnecting the laser diode bars have been developed. An example of such an interconnection method can be illustrated in U.S. Pat. No. 5,305,344. It discloses that laser diode submounts, rather than the laser diode bars, are inserted into the grooves on the top surface of a monolithic substrate. The submount made of Tungsten-Copper, consisted of a laser diode bar and $Al_2O_3$ mesa. The laser diode bar can be positioned in the front of the submount and connected to the top metalized surface of the mesa by a gold foil. The mesa can be located in the middle of the submount. A substrate can be provided with a plurality of spaced apart generally parallel grooves. A soft solder layer can be disposed in each of the grooves. The rear sides of the submounts are inserted into the grooves. Electrical connection between the laser diode bars can be through the copper spacers between the bottom of the substrate and the top surface of the mesas. Unfortunately, there can be still a high probability of a interconnection failure, in a mode such as degradation of the laser diode bar, solder creep onto the bar, or contamination of the laser diode bars. Other known failure modes may include alloying, melting, vaporization, and arcing, which can lead to a catastrophic destruction of the laser diode bars forming the array.

U.S. Pat. Nos. 6,636,538 and 7,060,515, as well as U.S. Pat. No. 5,898,211 disclose the different methods to build the laser diode bars array to solve the aforementioned problem by providing a laser diode package that includes a heat sink, a laser diode bar, and an electrically nonconductive substrate. Each individual package can be tested to ensure that it will function with the operational parameters desired for a laser bar array. The exposed second side surface of the laser diode bar preferably includes a layer of solder so that two packages can be joined. Numerous individual packages can be made integral in such a fashion after reflowing at the special solder melting temperature, resulting in a multi-bar laser diode array. U.S. Pat. No. 6,424,667 discloses a similar method, but using CTE matched spacers material sandwiched bonding the laser diode bar first, and then affix a substrate of electrically insulating but thermally conducting material, forming a laser subassembly. The multi-subassembly later affixed together and bond to a big heat sink to form a laser diode array. This invention greatly improves the resistance to cycling fatigue in laser-diode stacks. However, all these methods need many different solders (melting points) for multi-reflowing procedures, to make the assembly cumbersome and inefficient. Also the bar pitch of the laser diode stack has the limitation to be small enough to meet some applications.

U.S. Pat. Nos. 6,295,307 and 6,352,873 disclose a method for assembling a diode laser assembly by locating a first conductive spacer on the first conductive spacer on a planer working surface, disposing a first solder perform on the first conductive spacer, placing a diode bar on the first solder preform, disposing a second solder preform on the diode bar, placing a second conductor spacer on the second solder preform, compressing the spacer, preforms and diode bar parallel together, heating the solder preforms above their melting temperatures, and allowing the melted solder preforms to harden by cooling. This sandwiched assembly can be extended to multi laser diode bars and spacers assemblies. The spacer-bar assemblies are then attached to the electrically non-conductive heat spreader substrate, and the substrate may then be attached to the coolant manifold. The mounting surface of the heat spreader substrate may be metalized or coated with a conductive material and grooves cut through the conductive layer. The spacers are soldered or otherwise conductively connected to the conductive layer, while the diodes are situated "above" spaced apart from the grooves. The coolant manifold, heat spreader, spacers-diode bars are soldered together for good thermal conduction. U.S. Pat. No. 7,864,825 provides an improved laser diode bars assembly method which overcomes aforementioned, and other, disadvantages of the prior art. A metallization insulating layer can be soldered to a heat sink first. A plurality of parallel grooves are cut through the insulating layer or into the heat sink leaving the insulating layer in the form of a mesh with plurality of parallel streets formed on the heat sink. A laser diode stack consisting of a plurality of laser diode bars and spacers preferably, but not necessarily, formed of the same material as the heat sink can be then soldered to the grooved insulating layer with the laser diode bars located over the grooves with the spacers affixed to the streets. With this arrangement, the individual street can be free to move with the expansion of the heat sink. However, these assemblies always go through multiple steps of thermal reflowing with different melting-points solders. High possibilities of degradation of the laser diode performances, even the laser bar crack occurs from the stress induced due to any mismatch of the thermal expansion coefficients among the heat sinks, insulating layers, and the laser diode bars if the high temperature hard solders used.

U.S. Pat. Nos. 6,913,108 and 6,310,900 disclose a method for the laser diode bars array assembly. The laser diode bars, heat sinks for sandwiching bars, spacer elements for supporting bars alignment and BeO substrate are built altogether to reflow over the solder Indium melting temperature for bonding all the components into the laser diode assembly at one time. The BeO substrate includes a plurality of locating channels and coated with a metallization layer on both its upper and lower surfaces prior to assembly. The upper surface of the pedestals can be subjected to a process whereby that metallization layer can be removed therefrom. This ensures that there can be electrical isolation below the laser diode bars. Although only one solder Indium involved in the reflow procedure seems simple and efficient, a lot of problems, such as solder creeping and emitting surface contamination, greatly affect the yield of the assembly. It doesn't illustrate how to hold so many components in positions and alignment during thermal cycling. Every foregoing U.S. patent is hereby incorporated by reference in its entirety.

Thus, there is a need for a semiconductor laser diode array that can be fabricated in such a manner to eliminate known failure modes associated with fluxed soldering interconnection methods while at the same time minimizing stress caused by packaging to prevent damage to the laser diode arrays during assembly.

The present invention provides a simple and inexpensive laser diode stack assembly method, which minimizes any stress during the reflowing thermal cycling. The performance and reliability of the laser diode bar stack are greatly improved.

SUMMARY OF THE INVENTION

The invention includes a stacked array embodiment of a laser diode bars assembly, and method for assembling the stacked array. The apparatus includes a laser diode bar stack assembly, including a laser diode bar subassembly having a plurality of laser diode bars separated by electrically conductive spacers, each of the spacers attaching an electrically insulative heat spreader; and a heat sink on the subassembly mounting, wherein the heat sink dissipates heat either actively or passively. The laser diode bar has an Anti-Reflective (AR) surface and a High-Reflective (HR) surface. Each of the spacers has a uppermost surface and a bottommost surface. The spacer can be formed of an electrically conductive material whose Coefficient of Thermal Expansion (CTE) matches that of the laser diode bar, such as a CuW alloy, a CuMo alloy, or a Cu/diamond composite. The spacer has a height that can be longer than the cavity length of the laser diode bar. The height of the spacer can be the distance between the uppermost surface of the spacer and the bottommost surface of the spacer. The spreader has both surfaces metalized and a width of the same as that of the spacer. The spreader can be formed of an electrically insulative material with high thermal conductivity, such as AlN, BeO, SiC, or Si.

The plurality of laser diode bars, the spacers and the spreaders are soldered together forming the laser diode bar subassembly. The laser diode bar subassembly has the arrangement of the laser diode bars and the spacers in alternating contact, with each the laser diode bar locating between and in contact with two spacers. The AR surfaces of the laser diode bars have a substantially flush position with respect to the uppermost surfaces of the spacers. The HR surfaces of the laser diode bars have a recess with respect to the bottommost surfaces of the spacers. The spreaders are disposed to the bottommost surfaces of the spacers. The laser diode bars are soldered to the spacers, and the spacers are soldered to the spreaders by a high-melting-temperature AuSn solder. The subassembly bonding with the heat sink can be by a low-melting-temperature In solder.

The method can include the following steps: (a) locating a first conductive spacer upon a planar working surface; (b) disposing a first high-melting-temperature solder preform, such as AuSn, upon the first conductive spacer; (c) placing the first laser diode bar upon the first high-melting-temperature solder preform; (d) disposing a second high-melting-temperature solder preform upon the first laser diode bar; (e) placing a second conductive spacer upon the second high-melting-temperature solder preform; (f) repeating (b)-(e) till the last laser diode bars and the last conductive spacers placed; (g) compressing and holding the spacers, the high-melting-temperature solder preforms and the laser diode bars together; (h) disposing the same high-melting-temperature solder preforms upon the insulating heat spreader, in which both the size of the preform and the spreader are substantially the same as the bottom size of the spacer; (i) disposing the laser diode bars and the spacers upon the high-melting-temperature solder preforms and the heat spreaders; (j) all the above components of the laser diode bar subassembly are soldered integrallly with each other by one heating step, because one kind of solder high-melting-temperature preform is used; (k) the bottom surfaces of the heat spreaders in the subassembly will bond, by another, lower melting temperature solder preform, to a thermal reservoir such as Cu block either with or without cooling water adapted to pass through; (l) the laser diode bar assembly can be formed by reflowing the combination in (k). When holding the solder performs and laser diode bars together, special fixtures can be used to make sure the front emitting surfaces of the laser diode bars and the front surfaces of the spacers aligned well. No relative movements can be allowed among them in the later assembly process. The heat spreaders can be metalized on both of the top and bottom surfaces. Also, the heat spreaders affix the bottom of the spacers, while the bottom of laser diode bars hang between the gap of the spreaders. The two end heat spreaders can be bigger than the intermediate spacers, for the electrical connection to outside.

An alternative method embodiment can include providing a plurality of laser diode bars having Anti-Reflective (AR) surfaces and High-Reflective (HR) surface; providing a plurality of electrically conducting spacers, each of the spacers having a uppermost surface and a bottommost surface; forming an interlayered "sandwich" stack by arranging the laser diode bars and the spacers in alternating contact, with each the laser diode bar locating between and in contact with two spacers; providing a plurality of electrically insulative heat spreaders having a width that is approximately a width of the spacers, the width of the spacers being the distance between two side surfaces of the spacers for contacting the laser diode bars; arranging a plurality of the spreader structures such that a gap exists between adjacent ones of the plurality of heat spreader structures; attaching the spreader to the bottommost surfaces of the spacer one on one; forming a laser diode bar subassembly by soldering the laser diode bars, the spacers and the heat spreaders together; providing a heat sink either actively or passively dissipating heat; and forming a laser diode stack by soldering the subassembly on the heat sink.

BRIEF DESCRIPTION OF THE DRAWINGS

Further features and advantages of the invention can be better understood with reference to the following specification and attached drawings wherein.

Skilled artisans can appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE INVENTION

Figure 1:
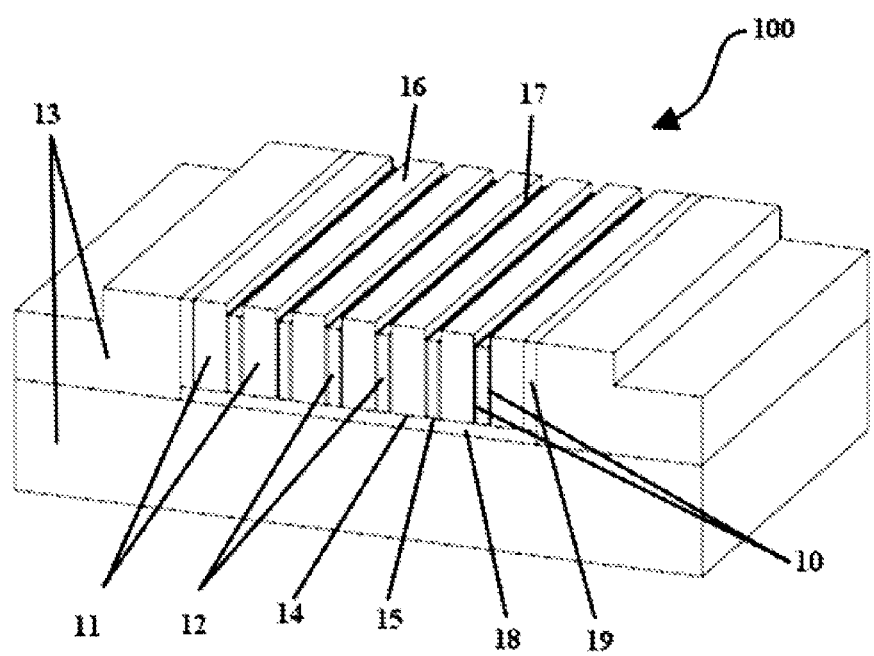
FIG. 1 is a perspective view of the fixture holding the spacers and laser diode bars in alternating contact arrangement, in accordance with the teachings of the present invention.

The present invention related to laser diode bar stack and method of assembly. FIG. 1 can be a schematic illustration of an assembly jig 100, which include a jig apparatus 13, electrically conductive spacers 11 and laser diode bars 12. The conductive spacers generally are Copper-Tungsten alloy, but also can be Copper-Molybdenum alloy, Copper-Diamond composite, or other alloy as long as the Coefficients of Thermal Expansion of the generally match that of laser diode bars. The assembly jig 13 can be made of stainless steel. The primary function of jig 13 can be for compiling the spacers and bars, and holding them in position. The polished ceramic plate 18 can be placed between jig 13 and the front surfaces 14 of the spacers 11, as well as the front facets 15 of the laser diode bars 12. The polished ceramic plate 19 can be placed between jig 13 and the two outside spacers 11. The ceramic plates 18 and 19 can be, for example, Alumina, Aluminum Nitride, or any non-wetting ceramic substrate.

In this first stage of the assembly, the first spacer 11 can be disposed on the buffer ceramic plate 19; the first high-melting-temperature solder preform 10 can be disposed on the first spacer. The high-melting-temperature solder preform 10 can be replaced by pre-deposited solder on the side surface of the spacer 11. In another embodiment, the pre-deposited solder process can replaced all the high-melting-temperature solder preforms 10 used later. The first laser diode bar 12 can be disposed on the first high-melting-temperature solder preform 10. The front facet surface 15 of the laser diode bar, also called Anti-reflective (AR) surface 15, aligns with the front surface 14 of the spacer by ceramic 18. The second high-melting-temperature preform 10 can be disposed on the first laser diode bar 12. The second spacer 11 can be disposed on the second high-melting-temperature solder preform 10. With a segment formed thusly, the bar can be fabricated by repeating the above process: dispose a first high-melting-temperature solder preform 10 on the respective spacer, dispose laser diode bar 12 on first high-melting-temperature solder perform 10, dispose second high-melting-temperature solder preform 10 on the opposite side of laser diode bar 12, and dispose in place spacer 11 again, continuing until the last laser diode bar 12 is disposed, then the last high-melting-temperature solder preform 10 and the last spacer 11 can be disposed thereon. The assembly jig 13 can be designed to the spacers-and-laser bars series combination. The front surfaces 14 of spacers and the front facet 15 of the laser diode bars are aligned well along the polished surface of the ceramic 18. As the height of the spacer 11 can be taller than the cavity length of the laser diode bar, the back facet 17 of the laser bar has a recess with respect to the back surface 16 of the spacer, also called the High-reflective (HR) surface. The pressure on the ceramic 19 for holding the spacers and laser diode bars has to be adequate but not too tight to cause extra stress on the laser diode bars, but tight enough not to allow the spacers or laser diode bars to drop. Little or no displacement between the spacers 11 and laser diode bars 12 may occur when jig 100 is turned upside down.

Figure 2A:
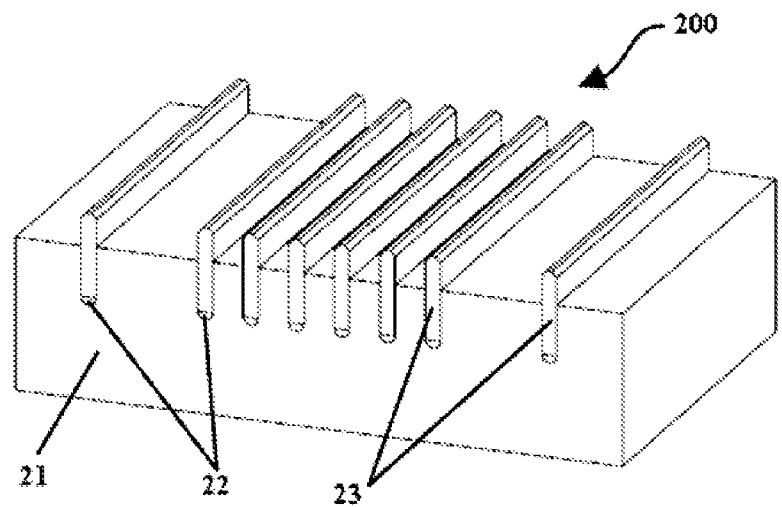
FIGS. 2A-2C is a perspective illustration of the fixture for the arrangement of the heat spreaders, in accordance with the teachings of the present invention.
Figure 2B:
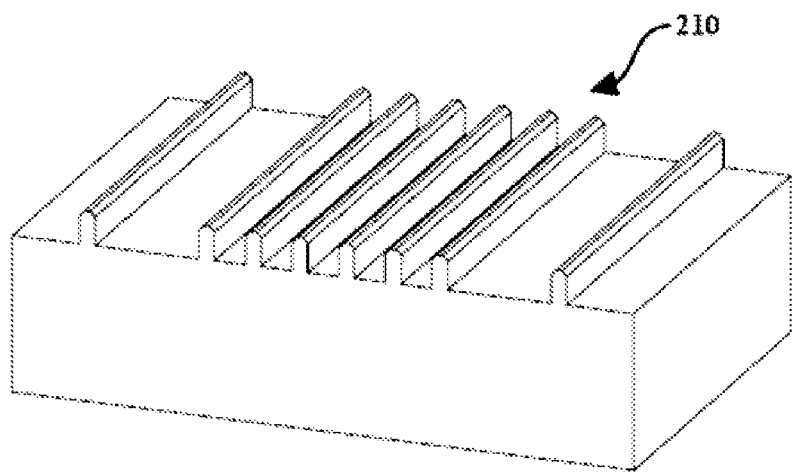
Figure 2C:
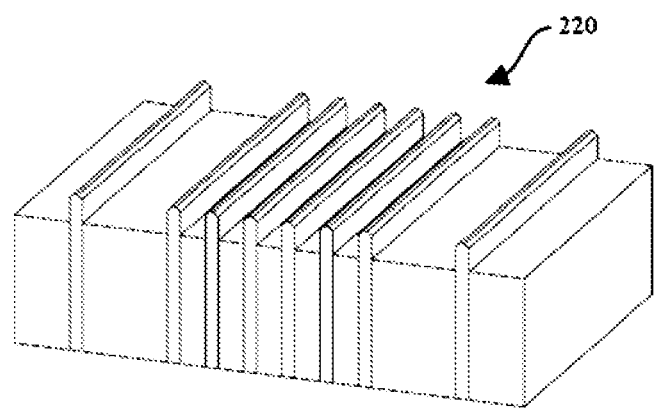

FIG. 2A shows fixture 200 for arranging electrically insulative heat spreaders. The substrate plate 21 of the fixture 200 can be made of Alumina. A plurality of grooves 22 can be formed on the surface of plate 21. The grooves 22 are machined parallel to one another in a pattern, e.g., using a dicer or the like, leaving a plurality of parallel recessed grooves. The width of the groove 22 can be cut to about the same as the thickness of the laser diode bars by selecting the adequate thickness of the dicing blade. The distance between groove 22 can be the same as the width of the spacers 11 in FIG. 1. But the distance of the grooves on both ends of the plurality of grooves 22 can be large as shown in FIG. 2A-2C. The ceramic pieces 23 can be made so that the thickness of ceramic piece 23 can be just a little narrower than that width of groove 22, allowing the ceramic piece 23 to substantially perfectly fit into the groove 22. The depth of groove 22 should be deep enough to hold ceramic piece 23 firmly without shaking and moving. The height of ceramic piece 23 can be also designed so that the protruding part of ceramic piece 23 above the surface of plate 21 can be a predetermined height after bottom part of ceramic pieces 23 are inserted into grooves 22. This height will be explained later in FIG. 3A. The edge of ceramic pieces 23 can be trimmed to make the edge radius large enough to avoid any burrs.

FIGS. 2B and 2C illustrate the alternative embodiments for replacing fixture 200. As shown in FIG. 2B, the fixture 210 can be made from one piece, for example, fixture 210 can be built from one mold sintering. Fixture 210 also may be a machined part, which may be easily purchased from any machine shop. FIG. 2C shows the fixture 220 can be built from small pieces bonded together by epoxy. Alternatively, solder bond together all the lower areas of those metalized pieces with higher melting temperature solder.

Figure 2D:
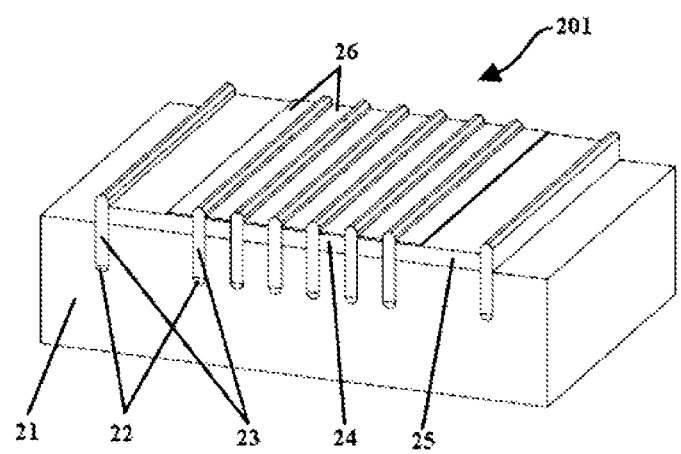
FIG. 2D can be a perspective illustration of the fixture shown filled with the spreaders and the solder preforms, in accordance with the teachings of the present invention.

In FIG. 2D, the heat spreaders are designed with an adequate size to fit in the place between the ceramic walls 23. The heat spreaders 24 and 25 may be formed of a ceramic such as aluminum nitride or any other thermally conductive, electrically insulating material generally used for such purpose, (e.g., Beryllium oxide, Silicon carbide, Silicon, or insulating composites containing diamonds) and are metalized on both surfaces. Actually the size of the spreaders 24 can be about the same as that of the spacer mentioned in FIG. 1. The spreaders 25 are much wide to fit the outside gaps fenced by ceramic walls 23. The high-melting-temperature solder preforms 26, the same size as that of 24, are disposed on the spreaders including the spreaders 25. The solder preforms can be bypassed if pre-deposited solder on the spreader surface. The thickness of the spreader should not be higher than the protruding part of ceramic walls 23 on the surface of 21 shown in FIGS. 2A-2C. However, the bulging height of ceramic walls 23 after the spreaders are disposed should be shorter than the recess of the surface 17 of the laser diode bar with respect to the surface 16 of the spacer shown in FIG. 1.

Figure 3A:
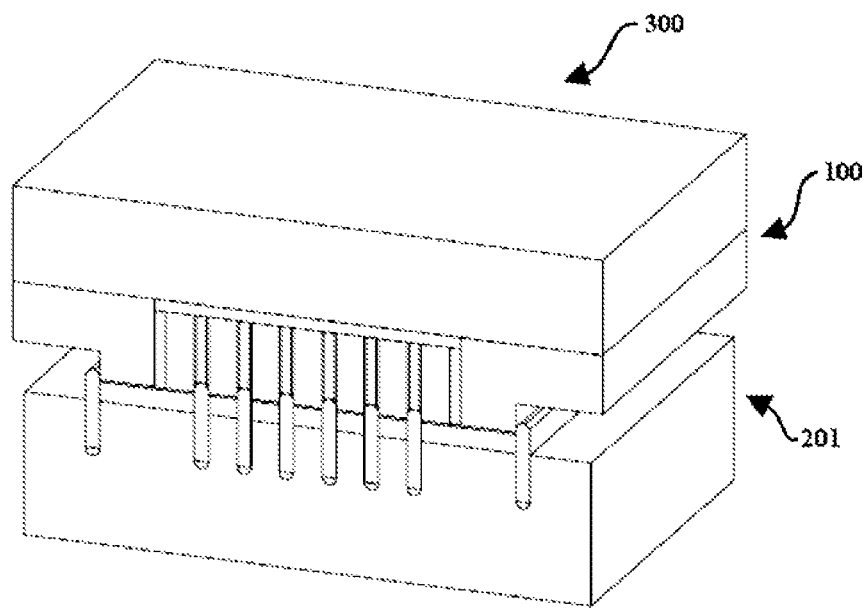
FIGS. 3A and 3B are the exploded views of the stack comprising of the spacers and laser diode bars as shown in FIG. 1 can be placed on the heat spreaders as shown in FIG. 2D, in accordance with the teachings of the present invention.
Figure 3B:
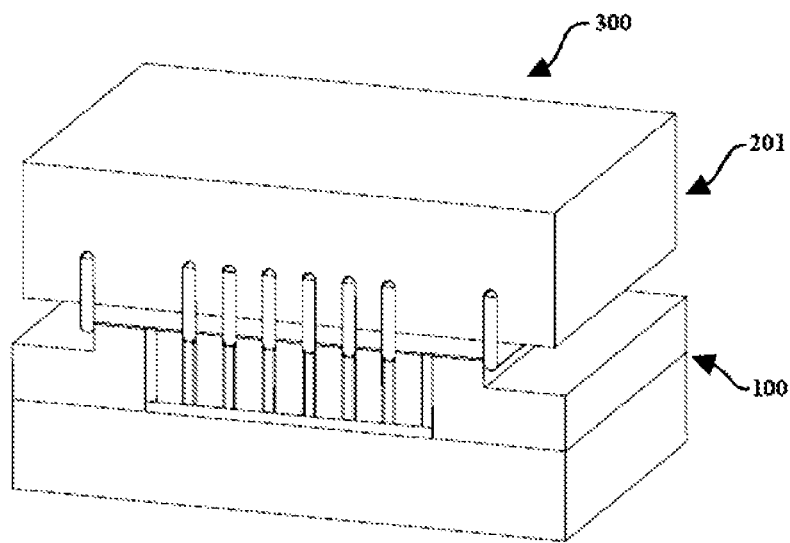
Figure 4:
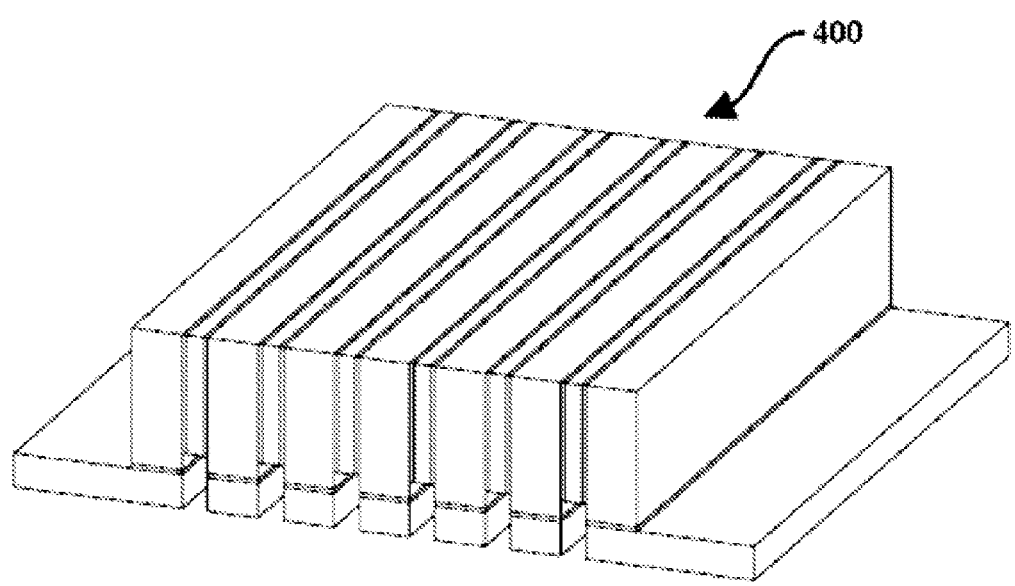
FIG. 4 is a perspective view of the completed subassembly including spacers, laser diode bars and spreaders after one step heating reflow, in accordance with the teachings of the present invention.

In FIG. 3A, jig 100 is turned upside down and placed on structure 201, forming assembly 300. As mentioned above, the width of the spacers 11 in jig 100 can be about the same as that of heat spreaders 24 and the high-melting-temperature preforms 26 in structure 201, while the ceramic walls 23 are narrower than the thickness of the laser diode bars 12. Therefore, when jig 100 can be turned upside down and placed on the top of structure 201, the surfaces 16 of the spacers touch the solder preforms 26 and then the heat spreaders 24 and 25. The tops of ceramic walls 23 enter into the recess area of the laser diode bars 12 between the spacers 11, but do not touch the back facets 17 of the laser diode bars 12. In this way, the facets 17 of the laser diode bars 12 will not be damaged and no extra stress is applied on the laser diode bars in the later thermal cycling reflow. By a special fixture or even by bare hands holding assembly 300, turn assembly 300 upside down as shown in FIG. 3B. A block can be disposed on top of 300 in FIG. 3B or a designed fixture holding jig 100 and structure 201 together to push the heat spreaders 24 and 25 on the spacers 11 via the solder preform 26. Once this configuration of assembly has been established, the entire assembly 300 can be subjected to a heat step whereby the temperature of this laser bars assembly 300 can be brought above the melting point of the solder preforms 10 and 26 that can be positioned between the laser diode bars 12 and the spacers 11, and between the spacers 11 and the heat spreaders 23. The solder preforms begin to reflow such that the laser diode bars 12 and the spacers 11 bond each other, and the bottom surfaces of the spacers 11 bond with the heat spreaders 23. Once the heating step ends, the laser diode bars 12, the spacers 11 and the heat spreaders 24, 25 are bonded together to form a subassembly 400 as shown in FIG. 4. Fixtures other than jig 100 may be used to manufacture a subassembly, as would be known to a person having ordinary skill in the art.

In FIG. 4, as the Coefficient of Thermal Expansion (CTE) of the electrically conductive spacers matches that of the GaAs laser diode bars very well, no lateral stress is introduced during the hard solder thermal cycle reflow. An example hard solder can be, such as AuSn. Even if the Coefficient of Thermal Expansion (CTE) of the heat spreaders, e.g. for Aluminum Nitride, doesn't match that of GaAs laser diode bars, there is still little to no stress on the GaAs laser diode bars because of the individual heat spreader bonding with the spacer separately.

Figure 5:
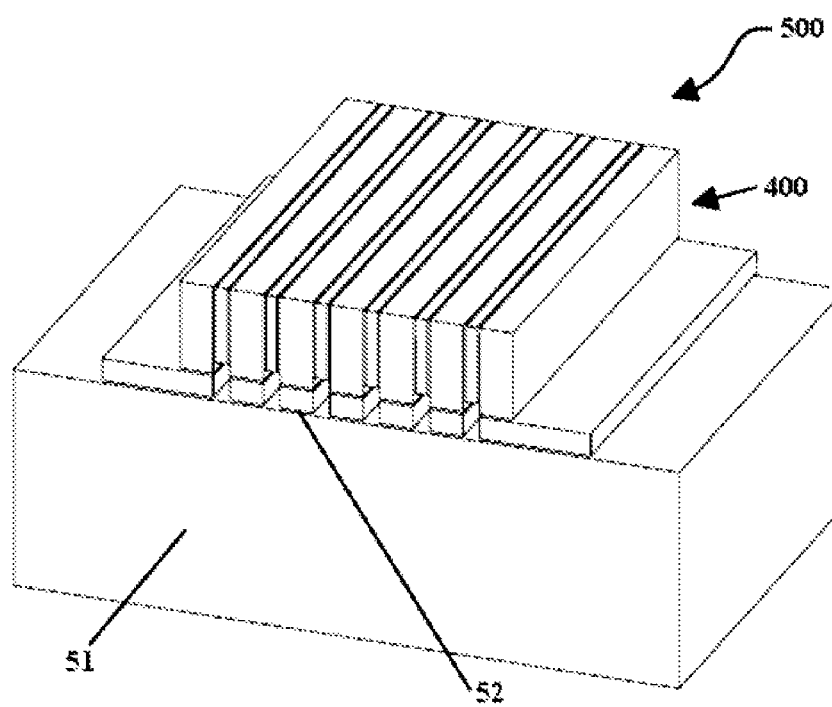
FIG. 5 is a perspective view of the embodiment of the assembly in the fully assembled condition, in accordance with the teachings of the present invention.

For high optical power output applications, about the same power waste heat has to be dumped. As shown in FIG. 5, the subassembly 400 can be soldered directly onto the ultimate heat sinking block 51. The heat sink 51 may be made of oxygen-free high thermal conductivity (OFHC) Copper, Copper-Tungsten alloy, Copper-Molybdenum alloy, or any materials with both high thermal conductivity and high heat capacity. The heat sink 51 could be actively cooled heat sink with cooling water passing through, depending on how much the heat generated by the laser diode bar stack operation. Generally the solder preform 52 used in assembly 500 can be low melting temperature solder, e.g. In, or InPb alloy, to avoid any stress on the laser diode bars to deteriorate the performance of the laser diode bar stack.

It can be thus seen that the present invention provides a simple, efficient and cost-effective solution to avoid the effect of stress induced due to mismatches in the CTE of components used in a laser diode bar stack assembly, when high temperature hard solder can be used.

One embodiment of the method of forming a laser stack assembly includes providing a plurality of laser diode bars having Anti-Reflective (AR) surfaces and High-Reflective (HR) surface; providing a plurality of electrically conducting spacers, each of the spacers having a uppermost surface and a bottommost surface; forming an interlayered "sandwich" stack by arranging the laser diode bars and the spacers in alternating contact, with each the laser diode bar locating between and in contact with two spacers; providing a plurality of electrically insulative heat spreaders having a width that is approximately a width of the spacers, the width of the spacers being the distance between two side surfaces of the spacers for contacting the laser diode bars; arranging a plurality of the spreader structures such that a gap exists between adjacent ones of the plurality of heat spreader structures; attaching the spreader to the bottommost surfaces of the spacer one on one; forming a laser diode bar subassembly by soldering the laser diode bars, the spacers and the heat spreaders together; providing a heat sink either actively or passively dissipating heat; and forming a laser diode stack by soldering the subassembly on the heat sink.

In another embodiment of a method of forming laser stack assemblies, the method includes (a) locating a first conductive spacer upon a planar working surface; (b) disposing a high-melting temperature first solder preform upon the first conductive spacer; (c) placing the first laser diode bar upon the first solder preform; (d) disposing a second solder preform upon the first laser diode bar; (e) placing a second conductive spacer upon the second solder preform; (f) repeating (b)-(e) until the last laser diode bar and the last conductive spacer are placed; (g) compressing and holding together the spacers, the solder performs, and the laser diode bars together; (h) disposing the same solder preforms upon the insulating heat spreader, wherein both a size of the preform and of the spreader are the same as a bottom size of the spacer; (i) disposing the laser diode bars and the spacers upon the solder preforms and the heat spreaders; (j) soldering the components integral with each other using one heating step, wherein one kind of solder perform is used, and wherein a laser diode bar subassembly is formed thereby; (k) bonding the bottom surfaces of the heat spreaders in the subassembly to a thermal reservoir by using a lower melting temperature solder perform than in (a) through (j), and (l) the laser diode bar assembly can be formed by reflowing the combination in (k).

The thermal reservoir is a Cu block either with or without cooling water through. The high-temperature solder preforms include an alloy of AuSn. The lower melting temperature solder performs include In, or InPb alloy. The heat spreaders can be metalized on both of the top and bottom surfaces. The spacer can be formed of an electrically conductive material whose CTE matches that of the laser diode bar. The electrically conductive material includes one of a CuW alloy, a CuMo alloy, or a Cu/diamond composite. The heat sink may be made of oxygen-free high thermal conductivity (OFHC)

Copper, Copper-Tungsten alloy, Copper-Molybdenum alloy, or any materials with both high thermal conductivity and high heat capacity.

Figure 6:
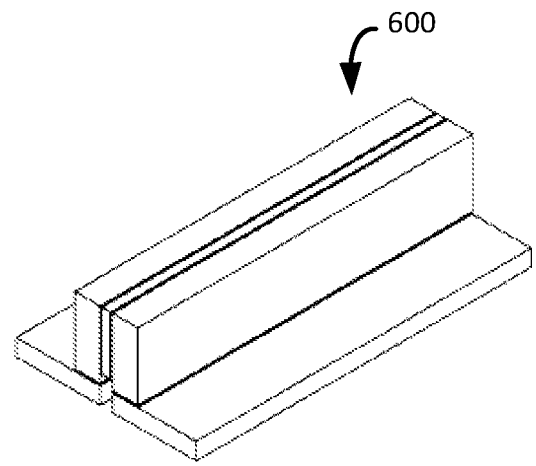
FIG. 6 is a perspective view of another embodiment of a laser subassembly, depicted as a single bar laser subassembly, in accordance with the teachings of the present invention.
Figure 7:
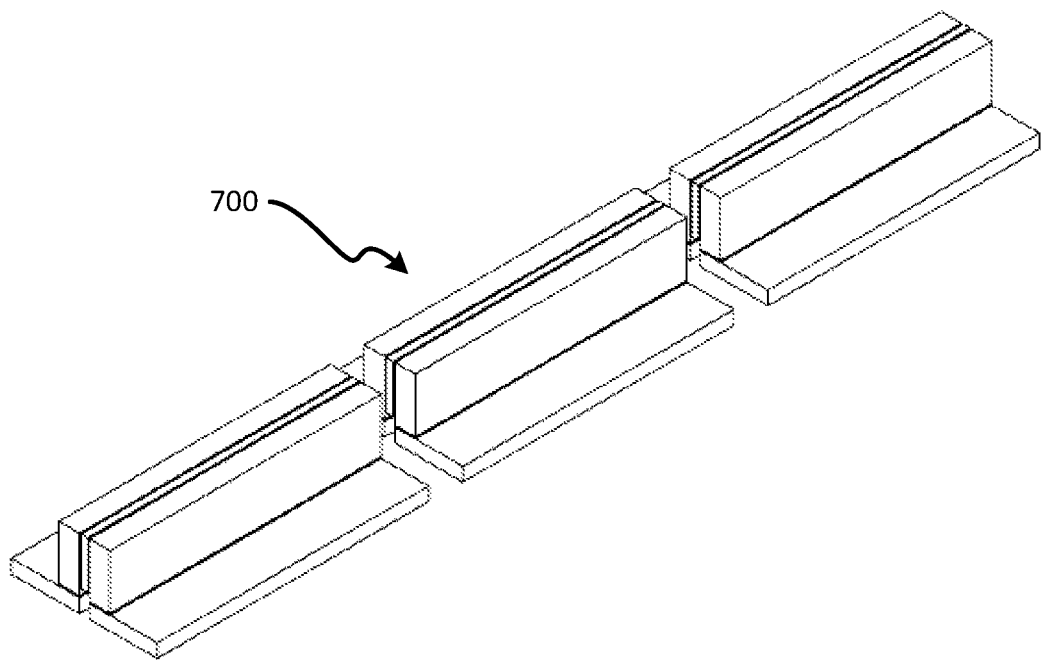
FIG. 7 is a perspective view of yet another embodiment of a laser subassembly, depicted as a 3×1 laser array subassembly, in accordance with the teachings of the present invention.
Figure 8:
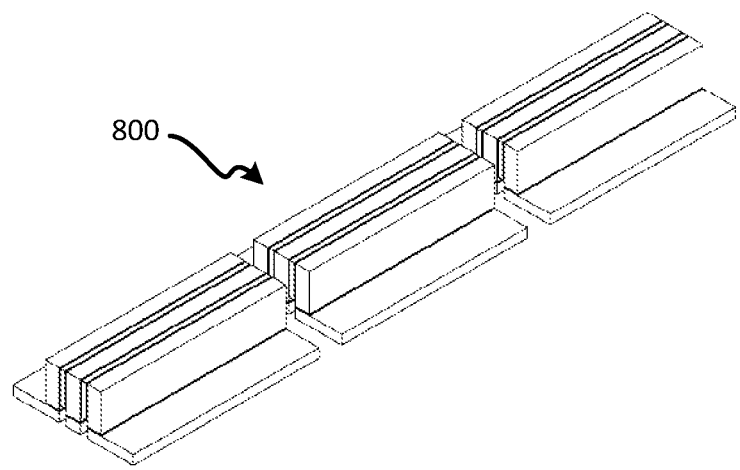
FIG. 8 is a perspective view of yet another embodiment of a laser subassembly, depicted as a 3×2 laser array subassembly, in accordance with the teachings of the present invention.
Figure 9:
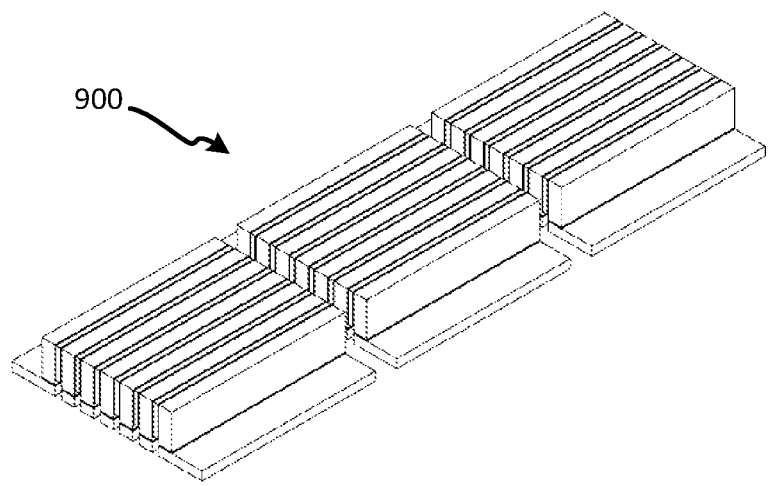
FIG. 9 is a perspective view of still another embodiment of a laser subassembly, depicted as a 3×6 laser array subassembly, in accordance with the teachings of the present invention.

A variety of laser subassemblies can be manufactured using the above principles. For example, FIG. 6 is depicted as a single laser bar subassembly 600. However, other laser configurations may be manufactured. In another embodiment, FIG. 7 illustrates a one-dimensional 3×1 laser array subassembly 700. In yet another embodiment, FIG. 8 depicts a two-dimensional array of a 3×2 laser array subassembly 800. Using the principles herein, as is shown in FIG. 9, it is possible to construct a 3×6 laser array subassembly 900 embodiment. As will be understood by a skilled artisan, other configurations having more or fewer laser bars than those illustrated may be manufactured using the teachings herein. It is possible to bond a thermal reservoir or heat sink to the single laser bar subassembly 600, in the manner described above. Similarly, one or more thermal reservoirs or heat sinks may be bonded to the array subassemblies 700, 800, or 900, also in the manner described above, individually or in clusters.

It should be emphasized that the above described embodiments of the present invention, particularly, any "preferred" embodiments, are merely possible examples of implementations, merely set forth for a clear understanding of the principles of the invention. Each of these embodiments and obvious variations thereof can be contemplated as falling within the spirit and scope of the invention, which can be set forth in the following claims.

What is claimed is:

1. A method of producing a laser diode stack assembly comprising:
   providing a plurality of laser diode bars having Anti-Reflective (AR) surfaces and High-Reflective (HR) surface;
   providing a plurality of electrically conducting spacers, each of the spacers having a uppermost surface and a bottommost surface;
   forming an interlayered "sandwich" stack by arranging the laser diode bars and the spacers in alternating contact, with each the laser diode bar locating between and in contact with two spacers;
   providing a plurality of electrically insulative heat spreaders having a width that is approximately a width of the spacers, the width of the spacers being the distance between two side surfaces of the spacers for contacting the laser diode bars;
   arranging a plurality of the spreader structures such that a gap exists between adjacent ones of the plurality of heat spreader structures;
   attaching the spreader to the bottommost surfaces of the spacer one on one;
   forming a laser diode bar subassembly by soldering the laser diode bars, the spacers and the heat spreaders together;
   providing a heat sink either actively or passively dissipating heat; and
   forming a laser diode stack by soldering the subassembly on the heat sink.

2. The method of claim 1, wherein the arranging the laser diode bars and the spacers in alternating contact further includes adjusting the position of the laser diode bars so as to move the AR surfaces of the laser diode bars into a substantially flush position with respect to the uppermost surfaces of the spacers.

3. The method of claim 1, wherein the step of arranging the laser diode bars and the spacers in alternating contact further includes the step of adding a high-melting temperature solder preform between the laser diode bar and the spacer.

4. The method of claim 3, wherein the high-melting temperature solder preform is made from AuSn.

5. The method of claim 1, wherein a gap between adjacent ones of the plurality of heat spreader structures is defined by a ceramic spacer.

6. The method of claim 5, wherein the ceramic spacer has a thickness shorter than the thickness of the laser diode bar.

7. The method of claim 5, wherein the ceramic spacer functions as a wall to separate the spreaders and has a height taller than the thickness of the spreader, but shorter than the sum of the thickness of the spreader and the recess of the HR surface of the laser diode bars with respect to the bottommost surface of the spacer.

8. The method of claim 1, wherein the step of attaching the spreader to the bottommost surface of the spacer further includes adding a high-melting temperature solder preform between the spreader and the bottommost surface of the spacer.

9. The method of claim 8, wherein the high-melting-temperature solder preform is made from AuSn.

10. The method of claim 1, wherein the soldering together of the laser diode bars, the spacers, and the heat spreaders occurs by the substantially simultaneous heating of the laser diode bar subassembly to melt the high-melting temperature solder preform.

11. The method of claim 1, wherein the soldering of the subassembly on the heat sink further includes adding a low-melting-temperature solder preform between the bottom of the subassembly and top surface of the heat sink.

12. The method of claim 3, wherein the low-melting-temperature solder preform is made from Indium.

13. A method of forming a laser diode assembly, comprising:
   (a) locating a first conductive spacer upon a planar working surface;
   (b) disposing a first solder preform upon the first conductive spacer;
   (c) placing the first laser diode bar upon the first solder preform;
   (d) disposing a second solder preform upon the first laser diode bar;
   (e) placing a second conductive spacer upon the second solder preform;
   (f) repeating (b)-(e) until the last laser diode bar and the last conductive spacer are placed;
   (g) compressing and holding together the spacers, the solder performs, and the laser diode bars together;
   (h) disposing the same solder preforms upon the insulating heat spreader, wherein both a size of the preform and of the spreader are the same as a bottom size of the spacer;
   (i) disposing the laser diode bars and the spacers upon the solder preforms and the heat spreaders;
   (j) soldering the components integral with each other using one heating step, wherein one kind of high-melting-temperature solder perform is used, and wherein a laser diode bar subassembly is formed thereby;
   (k) bonding the bottom surfaces of the heat spreaders in the subassembly to a thermal reservoir by using a lower melting temperature solder perform than in (a) through (j), wherein the thermal reservoir is a Cu block either with or without cooling water through; and
   (l) The laser diode bar assembly can be formed by reflowing the combination in (k),
wherein the high-melting-temperature solder preforms include an alloy of AuSn, wherein the low-melting-temperature solder perform include Indium,
wherein the heat spreaders can be metalized on both of the top and bottom surfaces,
wherein the spacer can be formed of an electrically conductive material whose CTE matches that of the laser diode bar, and
wherein the electrically conductive material includes one of a CuW alloy, a CuMo alloy, or a Cu/diamond composite.

* * * * *